(12) United States Patent
Lee

(10) Patent No.: US 11,342,250 B2
(45) Date of Patent: May 24, 2022

(54) LEAD FRAME FOR HERMETIC RF CHIP PACKAGE EMBEDDED WITH IMPEDANCE MATCHING FUNCTION

(71) Applicant: WAVEPIA CO., LTD., Gyeonggi-do (KR)

(72) Inventor: Sang-Hun Lee, Gyeonggi-do (KR)

(73) Assignee: WAVEPIA CO., LTD., Gyeonggi-do (KR)

( * ) Notice: Subject to any disclaimer, the term of this patent is extended or adjusted under 35 U.S.C. 154(b) by 155 days.

(21) Appl. No.: 17/009,116

(22) Filed: Sep. 1, 2020

(65) Prior Publication Data

US 2021/0272883 A1  Sep. 2, 2021

(30) Foreign Application Priority Data

Feb. 28, 2020 (KR) .................. 10-2020-0025184

(51) Int. Cl.
*H01L 23/495* (2006.01)
*H01L 25/16* (2006.01)
*H01L 23/66* (2006.01)

(52) U.S. Cl.
CPC .. *H01L 23/49541* (2013.01); *H01L 23/49589* (2013.01); *H01L 23/66* (2013.01); *H01L 25/16* (2013.01); *H01L 2223/6605* (2013.01)

(58) Field of Classification Search
CPC ............. H01L 25/16; H01L 23/49589; H01L 23/49541; H01L 23/66; H01L 23/64; H01L 23/057; H01L 2224/4026; H01L 2223/6655; H01L 2223/6605; H01L 23/495

USPC ......................................................... 257/666
See application file for complete search history.

(56) References Cited

U.S. PATENT DOCUMENTS

| 3,989,979 | A | * | 11/1976 | Konno | ..................... | H01J 23/10 |
| | | | | | | 315/39.77 |
| 5,267,379 | A | * | 12/1993 | Pak | .................... | H01L 23/49589 |
| | | | | | | 29/25.35 |
| 5,488,252 | A | * | 1/1996 | Johansson | ............... | H01L 23/66 |
| | | | | | | 257/578 |
| 5,973,567 | A | * | 10/1999 | Heal | ....................... | H01L 24/49 |
| | | | | | | 330/277 |

(Continued)

FOREIGN PATENT DOCUMENTS

| DE | 1013103119 A1 | * | 10/2013 | ........... H01L 23/142 |
| JP | 2007243145 A | * | 9/2007 | ... H01L 2224/48091 |

(Continued)

*Primary Examiner* — Alexander O Williams
(74) *Attorney, Agent, or Firm* — IPLA P.A.

(57) ABSTRACT

A lead frame for a hermetic RF chip package includes: a first capacitor unit formed of a conductive material in a rectangular shape having a width smaller than a length to receive an input of an RF signal applied to the package circuit; a first inductor unit connected to the first capacitor unit and formed of a conductive material in a rectangular shape having a width greater than a length; a second capacitor unit connected to the first inductor unit and formed of a conductive material in a rectangular shape having a width smaller than a length; and a second inductor unit connected to the second capacitor unit and formed of a conductive material in a rectangular shape having a width greater than a length to transfer an RF signal input through the first capacitor unit to the RF chip.

4 Claims, 2 Drawing Sheets

(56) References Cited

U.S. PATENT DOCUMENTS

| | | | | |
|---|---|---|---|---|
| 6,211,462 | B1* | 4/2001 | Carter, Jr. | H01L 23/3107 |
| | | | | 174/532 |
| 6,452,238 | B1* | 9/2002 | Orcutt | B81B 7/007 |
| | | | | 257/532 |
| 6,462,413 | B1* | 10/2002 | Polese | H01L 23/047 |
| | | | | 257/E23.185 |
| 9,922,894 | B1* | 3/2018 | Viswanathan | H01L 23/047 |
| 2001/0012198 | A1* | 8/2001 | Ketonen | H05K 13/0465 |
| | | | | 361/704 |
| 2012/0051000 | A1* | 3/2012 | Laidig | H01L 23/49568 |
| | | | | 361/736 |
| 2012/0067871 | A1* | 3/2012 | Sherrer | C23C 14/14 |
| | | | | 219/678 |
| 2016/0331960 | A1* | 11/2016 | Katnani | A61N 1/0534 |

FOREIGN PATENT DOCUMENTS

| | | | | |
|---|---|---|---|---|
| KR | 20080078120 A | * | 8/2008 | H01L 29/7783 |
| KR | 101191075 | | 10/2012 | |

* cited by examiner

LEAD FRAME FOR HERMETIC RF CHIP PACKAGE EMBEDDED WITH IMPEDANCE MATCHING FUNCTION

BACKGROUND

The present invention relates to a lead frame for a hermetic RF chip package embedded with an impedance matching function, and more specifically, to a lead frame for a hermetic RF chip package embedded with an impedance matching function, which can effectively perform input and output impedance matching, while efficiently reducing a bonding space for transferring signals between an RF chip and a package circuit.

Owing to spread of Information and Communications Technologies (ICT), various activities performed in outdoor spaces are gradually performed indoors. Accordingly, the proportion of indoor space in daily life gradually increases, and services provided for outdoor space such as navigation and the like are gradually expanding to indoor space.

To satisfy these service demands, Radio Frequency (RF) products providing high performance are proposed.

As described above, an RF chip and a package circuit are arranged in the neighborhood to provide high performance, and an RF product needs bonding for transfer of signals between the RF chip and the package circuit.

On the other hand, when a bonding process is performed using a metal wire, a conventional RF product requires a predetermined space between the RF chip and the package circuit, and there is a problem of increasing the volume of the RF product.

In addition, since the conventional RF product should adopt a separate circuit for performing impedance matching between an input port and an output port, there is a problem of increasing the volume of the RF product further more.

The background art of the present invention is disclosed in Korean Patent Registration No. 10-1191075.

SUMMARY OF THE INVENTION

Therefore, the present invention has been made in view of the above problems, and it is an object of the present invention to provide a lead frame for a hermetic RF chip package embedded with an impedance matching function, which can effectively perform input and output impedance matching, while efficiently reducing a bonding space for transferring signals between an RF chip and a package circuit.

The problems of the present invention are not limited to the problems mentioned above, and unmentioned other problems may be clearly understood by those skilled in the art from the following descriptions.

To accomplish the above object, according to one aspect of the present invention, there is provided a lead frame for a hermetic RF chip package embedded with an impedance matching function, wherein there is a step between an RF chip and a package circuit, and the lead frame is disposed between the RF chip and the package circuit to transfer RF signals applied to the package circuit to the RF chip, the lead frame comprising: a first capacitor unit formed of a conductive material in a rectangular shape having a width smaller than a length to receive an input of an RF signal applied to the package circuit; a first inductor unit connected to the first capacitor unit and formed of a conductive material in a rectangular shape having a width greater than a length; a second capacitor unit connected to the first inductor unit and formed of a conductive material in a rectangular shape having a width smaller than a length; and a second inductor unit connected to the second capacitor unit and formed of a conductive material in a rectangular shape having a width greater than a length to transfer an RF signal input through the first capacitor unit to the RF chip, wherein the first capacitor unit, the first inductor unit, the second capacitor unit, and the second inductor unit are formed in one piece, and as a bending unit is formed in a region where the first inductor unit is formed, a cross section is formed in the shape of obtuse angle ( ／‾ ).

In the lead frame for a hermetic RF chip package embedded with an impedance matching function according to an embodiment of the present invention, some regions of the first inductor unit and some regions of the second capacitor unit are preferably arranged to be spaced apart from the package circuit and the RF chip.

In the lead frame for a hermetic RF chip package embedded with an impedance matching function according to an embodiment of the present invention, the first capacitor unit, the first inductor unit, the second capacitor unit, and the second inductor unit are preferably formed of Cu, Al, Au or Ag.

In the lead frame for a hermetic RF chip package embedded with an impedance matching function according to an embodiment of the present invention, the area of the first capacitor unit is preferably smaller than the area of the second capacitor unit, and the area of the first inductor unit is preferably larger than the area of the second inductor unit.

DETAILED DESCRIPTION OF THE PREFERRED EMBODIMENT

Figure 1:
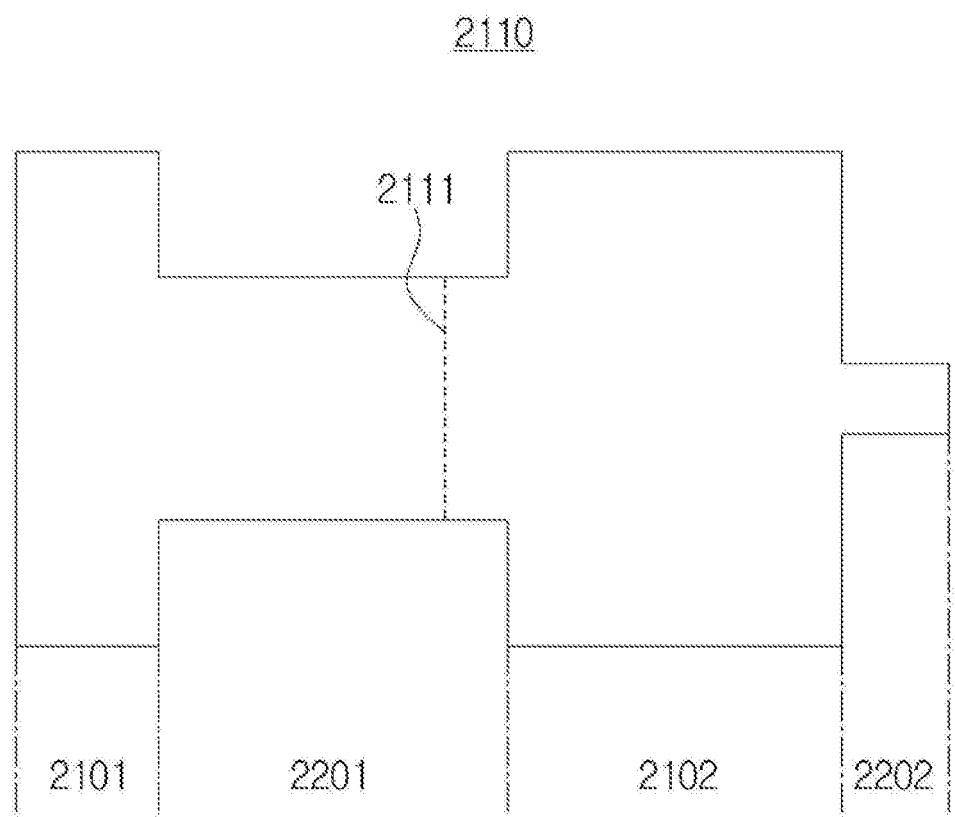
FIG. 1 is a plan view showing a lead frame for a hermetic RF chip package embedded with an impedance matching function according to an embodiment of the present invention.

The detailed description of the present invention described below refers to the accompanying drawings illustrating, by way of example, a specific embodiment in which the present invention may be practiced. These embodiments will be described in detail to be sufficient for those skilled in the art to embody the present invention.

It should be understood that although various embodiments of the present invention are different from each other, they do not need be mutually exclusive. For example, certain shapes, structures and properties described herein may be implemented in other embodiments without departing from the spirit and scope of the invention in relation to one embodiment.

In addition, it should be understood that the location or placement of individual components in each disclosed embodiment may be changed without departing from the spirit and scope of the invention.

Accordingly, the detailed description described below is not intended to be taken as a limited meaning, and the scope of the present invention, if appropriately described, is limited only by the appended claims, together with all the scopes equivalent to the claims.

In the drawings, like reference numerals refer to like or similar functions across various aspects, and a length, an area, a thickness, a shape or the like may be exaggerated for convenience.

Figure 2:
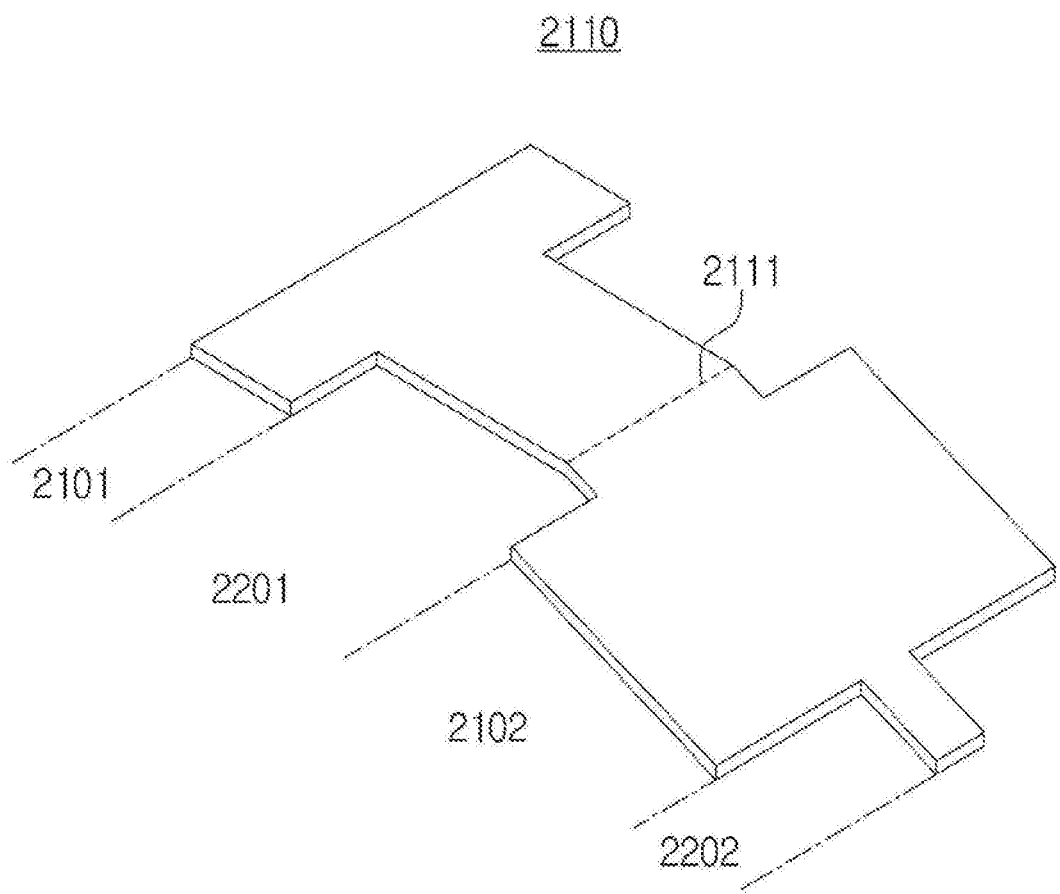
FIG. 2 is a perspective view showing a lead frame for a hermetic RF chip package embedded with an impedance matching function according to an embodiment of the present invention.
Figure 3:
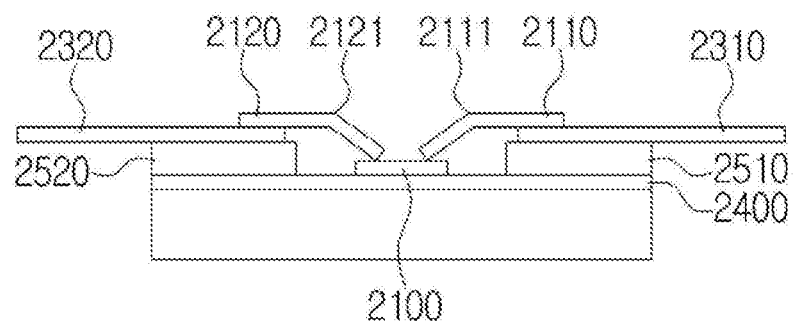
FIG. 3 is a cross-sectional view showing a lead frame for a hermetic RF chip package embedded with an impedance matching function according to an embodiment of the present invention.

As shown in FIGS. 1 to 3, a lead frame 2110 for a hermetic RF chip package embedded with an impedance matching function according to an embodiment of the present invention is configured to include a first capacitor unit 2101, a first inductor unit 2201, a second capacitor unit 2102, and a second inductor unit 2202. There is a step between an RF chip 2100 and a package circuit 2310, and the lead frame 2110 is disposed between the RF chip 2100 and the package circuit 2310 to transfer RF signals applied to the package circuit 2310 to the RF chip 2100.

The first capacitor unit 2101 receives an input of an RF signal applied to the package circuit 2310, and as shown in FIG. 1, it is formed by patterning a conductive material in a rectangular shape having a width smaller than a length, i.e., a rectangular shape having a long vertical side.

The first inductor unit 2201 is connected to the first capacitor unit 2101 as shown in FIG. 1, and is formed by patterning a conductive material in a rectangular shape having a width greater than a length, i.e., a rectangular shape having a long horizontal side.

The second capacitor unit 2102 is connected to the first inductor unit 2201 as shown in FIG. 1, and is formed by patterning a conductive material in a rectangular shape having a width smaller than a length, i.e., a rectangular shape having a long vertical side.

The second inductor unit 2202 is connected to the second capacitor unit 2102 and transfers an RF signal input through the first capacitor unit 2101 to the RF chip 2100, and as shown in FIG. 1, it is formed by patterning a conductive material in a rectangular shape having a width greater than a length, i.e., a rectangular shape having a long horizontal side.

Here, the first capacitor unit 2101, the first inductor unit 2201, the second capacitor unit 2102, and the second inductor unit 2202 are formed of Cu, Al, Au or Ag in one piece.

In addition, in the lead frame 2110 for a hermetic RF chip package embedded with an impedance matching function according to an embodiment of the present invention, a bending unit 2111 is formed in the region where the first inductor unit 2201 is formed, to have a cross section formed in the shape of obtuse angle ( ╱‾ ) as shown in FIGS. 2 and 3.

As described above, the lead frame 2110 for a hermetic RF chip package embedded with an impedance matching function according to an embodiment of the present invention may efficiently reduce the bonding space for transferring signals between the RF chip 2100 and the package circuit 2310 by patterning a conductive material to have a cross section formed in the shape of ╱‾ and brazing or soldering the RF chip 2100 and the package circuit 2310.

In addition, the lead frame 2110 for a hermetic RF chip package embedded with an impedance matching function according to an embodiment of the present invention may effectively perform input and output impedance matching although a separate input and output impedance matching circuit is not adopted, as the first capacitor unit 2101, the first inductor unit 2201, the second capacitor unit 2102, and the second inductor unit 2202 are formed in one piece, and signals are transferred between the RF chip 2100 and the package circuit 2310.

Here, when the area of the first capacitor unit 2101 is adjusted, capacitance of the first capacitor unit 2101 may be adjusted, and when the area of the first inductor unit 2201 is adjusted, inductance of the first inductor unit 2201 may be adjusted, and when the area of the second capacitor unit 2102 is adjusted, capacitance of the second capacitor unit 2102 may be adjusted, and when the area of the second inductor unit 2202 is adjusted, inductance of the second inductor unit 2202 may be adjusted.

Meanwhile, when some regions of the first inductor unit 2201 and some regions of the second capacitor unit 2102 are arranged to be spaced apart from the package circuit 2310 and the RF chip 2100 as shown in FIG. 3, an RF signal applied to the package circuit 2310 may be effectively radiated to the RF chip 2100.

In addition, when the area of the first capacitor unit 2101 is formed to be smaller than the area of the second capacitor unit 2102, and the area of the first inductor unit 2201 is formed to be larger than the area of the second inductor unit 2202, an RF signal applied to the package circuit 2310 may be stably transferred to the RF chip 2100.

The lead frame for a hermetic RF chip package embedded with an impedance matching function according to the embodiments of the present invention may efficiently reduce the bonding space for transferring signals between the RF chip and the package circuit by patterning a conductive material to have a cross section formed in the shape of obtuse angle ( ╱‾ ) and brazing or soldering the RF chip and the package circuit.

In addition, the lead frame for a hermetic RF chip package embedded with an impedance matching function according to an embodiment of the present invention may effectively perform input and output impedance matching although a separate input and output impedance matching circuit is not adopted, as the first capacitor unit, the first inductor unit, the second capacitor unit, and the second inductor unit are formed in one piece, and signals are transferred between the RF chip and the package circuit.

Although the present invention has been described and shown above in connection with a preferred embodiment for illustrating the principles of the present invention, the present invention is not limited to the configuration and operation as shown and described.

Rather, those skilled in the art will appreciate that many changes and modifications to the present invention are possible without departing from the spirit and scope of the appended claims.

Accordingly, all such suitable changes, modifications and equivalents should be considered as being also within the scope of the present invention.

What is claimed is:
1. A lead frame for a hermetic RF chip package embedded with an impedance matching function, wherein there is a step between an RF chip and a package circuit, and the lead frame is disposed between the RF chip and the package circuit to transfer RF signals applied to the package circuit to the RF chip, the lead frame comprising:
   a first capacitor unit formed of a conductive material in a rectangular shape having a width smaller than a length to receive an input of an RF signal applied to the package circuit;

a first inductor unit connected to the first capacitor unit and formed of a conductive material in a rectangular shape having a width greater than a length;

a second capacitor unit connected to the first inductor unit and formed of a conductive material in a rectangular shape having a width smaller than a length; and a second inductor unit connected to the second capacitor unit and formed of a conductive material in a rectangular shape having a width greater than a length to transfer an RF signal input through the first capacitor unit to the RF chip, wherein the first capacitor unit, the first inductor unit, the second capacitor unit, and the second inductor unit are formed in one piece, and as a bending unit is formed in a region where the first inductor unit is formed, a cross section is formed in a shape of obtuse angle.

2. The lead frame according to claim 1, wherein some regions of the first inductor unit and some regions of the second capacitor unit are arranged to be spaced apart from the package circuit and the RF chip.

3. The lead frame according to claim 1, wherein the first capacitor unit, the first inductor unit, the second capacitor unit, and the second inductor unit are formed of Cu, Al, Au or Ag.

4. The lead frame according to claim 1, wherein an area of the first capacitor unit is smaller than an area of the second capacitor unit, and an area of the first inductor unit is larger than an area of the second inductor unit.

* * * * *